United States Patent
Plankensteiner et al.

(10) Patent No.: US 6,479,975 B1
(45) Date of Patent: Nov. 12, 2002

(54) MOS CURRENT SENSE CIRCUIT

(75) Inventors: Manfred Plankensteiner, Germering (DE); Horst Knoedgen, Munich (DE)

(73) Assignee: Dialog Semicon, Kirchheim/Teck-Nabern (DE)

( * ) Notice: Subject to any disclaimer, the term of this patent is extended or adjusted under 35 U.S.C. 154(b) by 0 days.

(21) Appl. No.: 09/978,232

(22) Filed: Oct. 16, 2001

(30) Foreign Application Priority Data

Sep. 26, 2001 (EP) .............................. 01480092

(51) Int. Cl.[7] .............................. G05F 3/16; G05F 3/20
(52) U.S. Cl. .......................................... 323/316; 323/313
(58) Field of Search .................................. 323/316, 312, 323/313, 317

(56) References Cited

U.S. PATENT DOCUMENTS

| | | | | | |
|---|---|---|---|---|---|
| 4,553,084 A | * | 11/1985 | Wrathall | ...................... | 323/316 |
| 5,563,504 A | * | 10/1996 | Gilbert et al. | ............... | 323/316 |
| 5,572,161 A | * | 11/1996 | Myers | ......................... | 327/538 |
| 5,652,540 A | * | 7/1997 | Eilley | .......................... | 327/565 |
| 5,670,867 A | * | 9/1997 | Mitsuda | ..................... | 323/312 |
| 5,838,192 A | * | 11/1998 | Bowers et al. | ............... | 327/541 |
| 5,867,014 A | * | 2/1999 | Wrathall et al. | ............. | 323/316 |
| 5,877,617 A | * | 3/1999 | Ueda | ........................... | 323/316 |
| 5,973,550 A | * | 10/1999 | Bowers et al. | ............... | 327/541 |
| 6,107,789 A | * | 8/2000 | Fryer et al. | ................. | 323/316 |
| 6,166,530 A | * | 12/2000 | D'Angelo | .................... | 323/316 |

* cited by examiner

Primary Examiner—Bao Q. Vu
(74) Attorney, Agent, or Firm—George O. Saile; Stephen B. Ackerman; Douglas R. Schnabel

(57) ABSTRACT

A new current sense circuit has been achieved. The current sense circuit comprises, first, a first MOS transistor having a gate, a drain, and a source. The gate is coupled to a control signal. The drain is coupled to a load such that a load current flows through the first MOS transistor when the control signal is ON. A second MOS transistor has a gate, a drain, and a source. The gate is coupled to the control signal. The drain is coupled to a constant current source such that the constant current flows through the second MOS transistor when the control signal is ON. The source is coupled to the source of the first MOS transistor. The first and second MOS transistors are operating in the linear region when the control signal is ON. Finally, a means to compare the first MOS transistor drain voltage and the second MOS transistor drain voltage is provided.

20 Claims, 3 Drawing Sheets

MOS CURRENT SENSE CIRCUIT

BACKGROUND OF THE INVENTION

1 Field of the Invention

The invention relates to a current sense circuit, and more particularly, to an MOS current sense circuit with improved accuracy.

2 Description of the Prior Art

Current sense circuits are widely used in integrated circuits. If a potentially large output, or load, current must be driven by an on-chip switch, a current sense circuit may be used to detect the relative or absolute value of this current. The current level may be monitored to prevent damage to the switch or to the integrated circuit from either a short circuit or a simple overloading.

Referring now to FIG. 1, a simplified schematic of a current sense circuit is illustrated. This circuit illustrates a problem common in current sense circuits of the art. In this circuit, a resistive load, $R_{LOAD}$ 10, is driven by a low-side, NMOS transistor $M_{OUT}$ 14. $R_{LOAD}$ 10 is an external resistor that is coupled between an external voltage supply, $V_{EXT}$ 22, and the OUT pin of the circuit. $M_{OUT}$ 14 is turned ON and OFF by the logic signal CONTROL 30 which is coupled to the gate of $M_{OUT}$ 14.

The current sense scheme of this circuit uses a simple current mirror approach wherein a mirroring device, $M_{SENSE}$ 18, creates a sense current, $I_{SENSE}$, that is proportional to the load current, $I_{LOAD}$. The NMOS transistor $M_{SENSE}$ 18 may be constructed substantially smaller than $M_{OUT}$ 14. Since $M_{SENSE}$ 18 receives the same gate drive as $M_{OUT}$ 14, both devices conduct at the same time. $I_{SENSE}$ is mirrored using the PMOS devices M3 38 and M4 42 to create the mirror current $I_{S2}$. $I_{S2}$ flows through the sense resistor $R_{SENSE}$ 46 to create a voltage at node B. The voltage at node B is then compared to a reference voltage, $V_{REF}$ 50, using a simple comparitor circuit 54. If the voltage at B exceeds $V_{REF}$ 50, the comparitor enables the OC 58, or over current, output.

A key problem in this approach is the operating characteristics of $M_{SENSE}$ 18 and of $M_{OUT}$ 14. $M_{OUT}$ 14 is operating in the linear, or ohmic, region. Therefore, variations in $I^{LOAD}$ cause variations in the drain-to-source voltage across $M_{OUT}$ 14. Further, since $M_{OUT}$ 14 is designed to have a low ON resistance, this drain-to-source voltage drop is relatively small.

However, $M_{SENSE}$ 18 is operating in a different region. Specifically, the presence of the mirroring device M3 38 insures that a relatively large voltage exists at node A and, therefore, as the drain-to-source voltage of $M_{SENSE}$ 18. $M_{SENSE}$ 18 may therefore be operating in a saturation region. The drain current of $M_{SENSE}$ 18 may not correspond to the drain current of $M_{OUT}$ 14, even though both receive the same gate drive. Therefore, $I_{SENSE}$ may not proportionally correspond to $I_{LOAD}$. On the contrary, if the circuit is altered such that $M_{SENSE}$ 18 is operating in the linear region, then the drain-to-source voltage must somehow be carefully controlled to track that of $M_{OUT}$ 14 in order to obtain a good current proportionality.

Several prior art inventions describe current sensing circuits. U.S. Pat. 5,877,617 to Ueda describes a load current sensing circuit. The gates and drains of the power and sensing MOSFETs are coupled together. A sensing resistor is coupled between the sensing transistor source and ground. Compensation resistors are used to improve temperature performance. U.S. Pat. No. 5,670,867 to Mitsuda teaches an MOS load current sensing circuit. A CMOS pair is used to feedback the drain-to-source voltage of the output device to a comparitor. A fixed voltage reference is used as the other comparitor input. U.S. Pat. No. 5,652,540 to Eilley discloses a load current sensing circuit for a bipolar driver.

SUMMARY OF THE INVENTION

A principal object of the present invention is to provide an effective and very manufacturable MOS current sense circuit.

A further object of the present invention is to provide a current sense circuit where the sense current is more accurately proportional to the load current.

A still further object of the present invention is to improve accuracy by operating both the load transistor and the sense transistor in the linear region and comparing the drain-to-source voltages.

Another still further object of the present invention is to provide an NMOS, low-side drive or a PMOS, high-side drive current sense.

Another still further object of the present invention is to provide an adjustable or trimmable current sense circuit to improve precision.

Another still further object of the present invention is to provide a current sense circuit that may be incorporated a into current limit.

In accordance with the objects of this invention, a new current sense circuit has been achieved. The current sense circuit comprises, first, a first MOS transistor having a gate, a drain, and a source. The gate is coupled to a control signal. The drain is coupled to a load such that a load current flows through the first MOS transistor when the control signal is ON. A second MOS transistor has a gate, a drain, and a source. The gate is coupled to the control signal. The drain is coupled to a constant current source such that the constant current flows through the second MOS transistor when the control signal is ON. The source is coupled to the source of the first MOS transistor. The first and second MOS transistors are operating in the linear region when the control signal is ON. Finally, a means to compare the first MOS transistor drain voltage and the second MOS transistor drain voltage is provided.

BRIEF DESCRIPTION OF THE DRAWINGS

In the accompanying drawings forming a material part of this description, there is shown.

DESCRIPTION OF THE PREFERRED EMBODIMENTS

The preferred embodiments disclose a current sense circuit of the present invention. This current sense circuit is described in four embodiments. It should be clear to those experienced in the art that the present invention can be applied and extended without deviating from the scope of the present invention.

Figure 1:
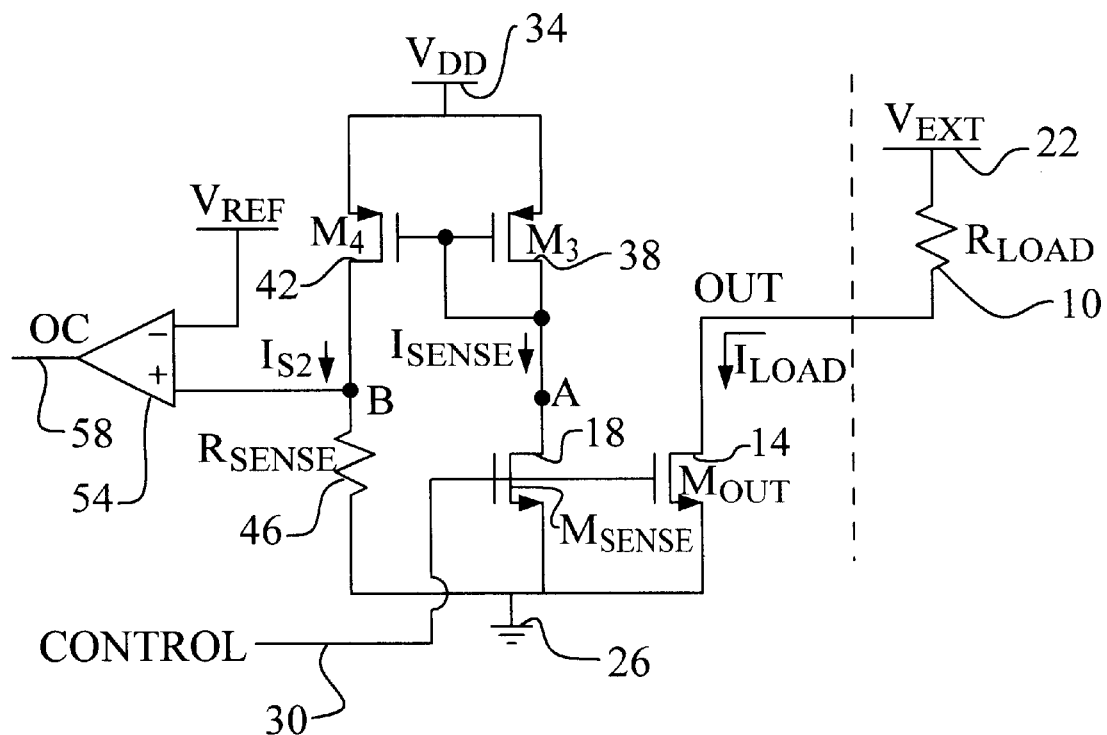
FIG. 1 illustrates a prior art current sense circuit using a simple current mirror.
Figure 2:
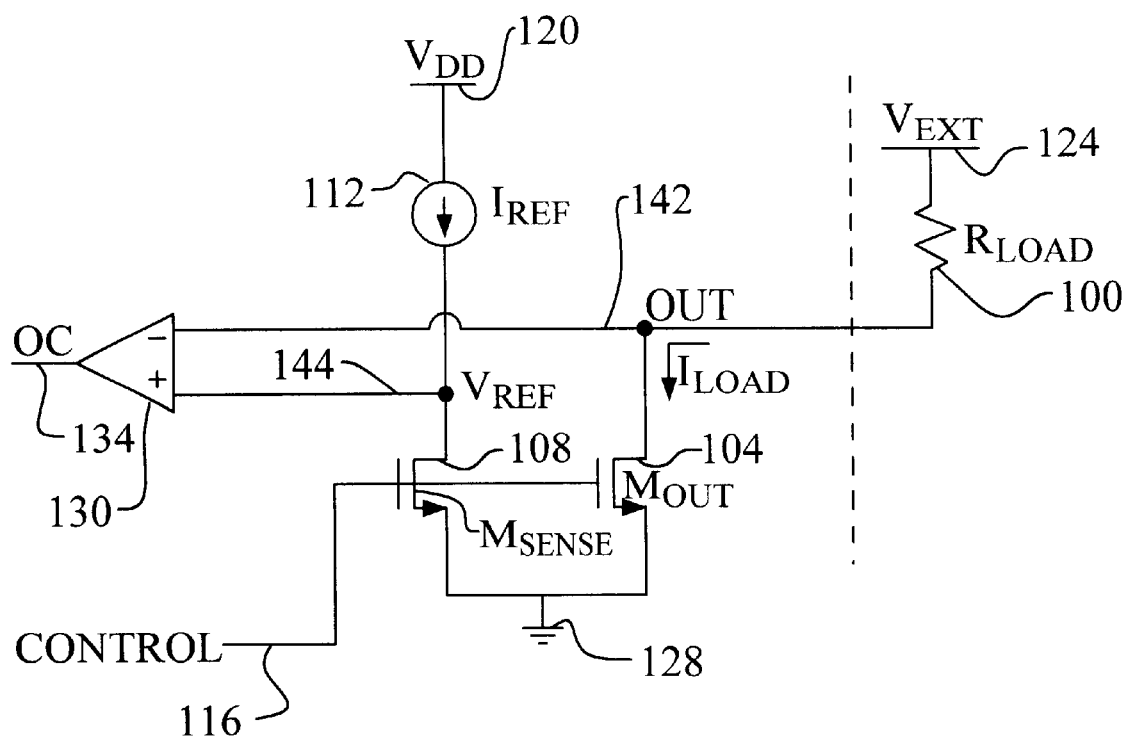
FIG. 2 illustrates a first preferred embodiment of the present invention for a low-side drive output current sense.

Referring now to FIG. 2, a first preferred embodiment of the present invention is illustrated. Several important features of the present invention are shown. This novel current sense circuit exhibits very accurate current sensing. The circuit is preferably formed on a common substrate.

In this embodiment, current is sensed for a low-side driver output comprising an NMOS transistor, $M_{OUT}$ 104. The gate of $M_{OUT}$ 104 is coupled to a control signal, CONTROL 116. The drain is coupled to the output pin of the circuit, OUT 142. The source is preferably coupled to ground 128. A load, $R_{LOAD}$ 100, is coupled between OUT 142 and an external voltage source, $V_{EXT}$ 124. Alternatively, the internal voltage source could be used. The low-side driver 104 is turned ON when the CONTROL voltage is above the threshold of $M_{OUT}$ 104.

Most important to the present invention, a novel method of current sensing is provided by the sensing transistor, $M_{SENSE}$ 108, constant current source, $I_{REF}$ 112, and comparitor 130 in combination with $M_{OUT}$ 104. More specifically, the gate of the sensing transistor, $M_{SENSE}$ 108, is coupled to CONTROL 116. The source is coupled to ground 128. In this configuration, $M_{SENSE}$ 108 receives the same gate drive as $M_{OUT}$ 104.

A constant current source, $I_{REF}$ 112, is coupled to the drain of $M_{SENSE}$ 108. The presence of $I_{REF}$ 112 is unique and advantageous to the present invention. In this configuration, the ON-state drain current Of $M_{SENSE}$ 108 is established as exactly $I_{REF}$ 112 since current flow into the high impedance inputs of the comparitor 130 is negligible. Further, as long as $I_{REF}$ 112 is below the saturation current Of $M_{SENSE}$ 108, the sense transistor will operate in the linear region. By maintaining $M_{SENSE}$ 108 operation in the linear, or ohmic, region, the operating characteristics of $M_{SENSE}$ 108 will match those of $M_{OUT}$ 104.

To take best advantage of this configuration, $M_{OUT}$ 104 and $M_{SENSE}$ 108 must be scaled. More specifically, each device has a width-to-length (W/L) ratio. The width-to-length (W/L) ratio of $M_{OUT}$ 104 is designed much larger than the width-to-length (W/L) ratio of $M_{SENSE}$ 108. Therefore, $M_{OUT}$ 104 is capable of sinking a much larger drain current than $M_{SENSE}$ 108 under the same operating conditions. The quotient of the width-to-length (W/L) ratio Of $M_{OUT}$ 104 divided by the width-to-length (W/L) ratio of $M_{SENSE}$ 108 is defined as the sense ratio (n) of the current sense circuit. Preferably, the sense ratio (n) is between about 1 and 10,000, and more preferably, between about 2 and 50. For example, if the sense ratio is 100, then $M_{OUT}$ 104 will conduct about 100 times the drain current of $M_{SENSE}$ 108 under the same gate bias and drain-to-source bias conditions. Note that, by operating both devices in the linear range, variations in processing will track between both devices. Further, to achieve optimal matching, $M_{OUT}$ 104 and $M_{SENSE}$ 108 should preferably comprise a common length and a common physical orientation as well as being formed on a common substrate.

After selecting the sense ratio, the remaining concern is to select the reference current, $I_{REF}$ 112. Once again, $I_{REF}$ 112 must be sufficiently small to keep $M_{SENSE}$ 108 in the linear region. VREF 144 is the drain-to-source voltage, or simply, the drain voltage of $M_{SENSE}$ 108 necessary to conduct $I_{REF}$ 112 at the gate voltage CONTROL 116. Finally, by selecting a particular $I_{REF}$ 112 value, the current sense circuit can be customized to a particular load current, $I_{LOAD}$, value. The voltage at VREF 144 for a specific $I_{REF}$ 112 will equal the voltage at OUT 142 for a specific $I_{LOAD}$. For example, if the sense ratio is 100 and $I_{REF}$ 112 is 1 mA, then a VREF 144 value is generated that equals the OUT 142 voltage when $I_{LOAD}$ equals 100 mA. The $I_{LOAD}$ value where $V_{REF}$ 144 equals OUT 142 is given by $n \times I_{REF}$ The OUT voltage 142 and the $V_{REF}$ 144 voltage are compared. The means of comparing 130 is preferably a comparitor circuit of conventional design. When the output load current, $I_{LOAD}$, is small, then OUT 142 will be smaller than $V_{REF}$ 144 and the over current signal, or OC 134, is not asserted. When OUT 142 exceeds $V_{REF}$ 144, then OC 134 is asserted to indicate an over current condition on the output.

Figure 3:
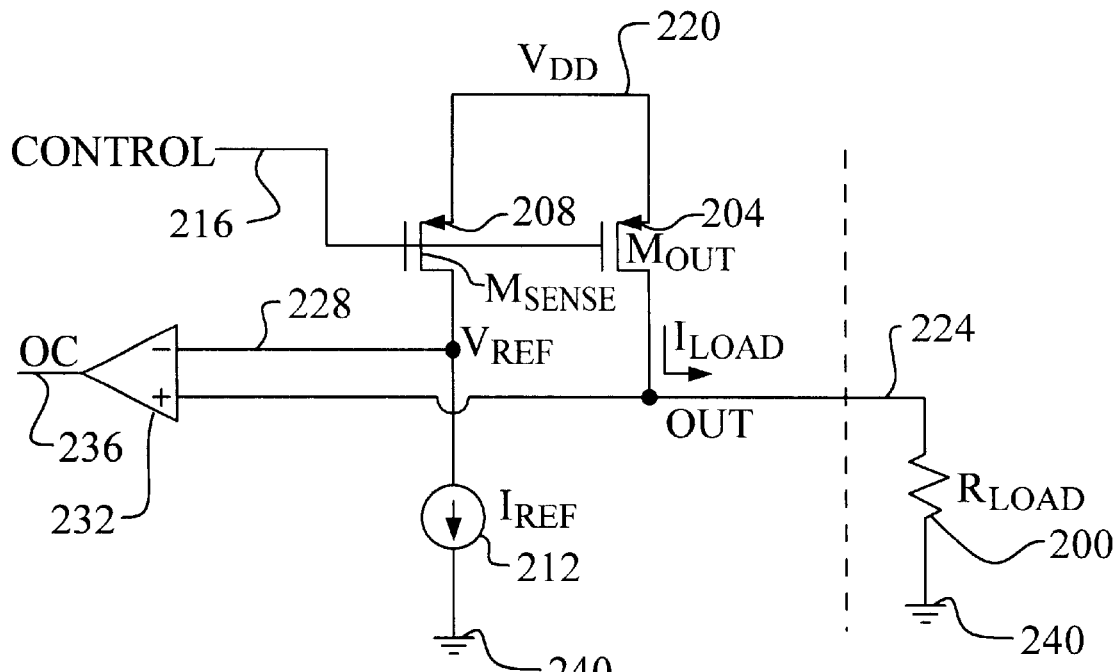
FIG. 3 illustrates a second preferred embodiment of the present invention for a high-side drive output current sense.

Referring now to FIG. 3, a second preferred embodiment of the present invention is illustrated. In this embodiment, the output is configured as a high-side driver. The output transistor, $M_{OUT}$ 204, and the sense transistor, $M_{SENSE}$ 208, are PMOS transistors. As in the first embodiment, the gates and sources of $M_{OUT}$ 204 and $M_{SENSE}$ 208 are coupled together. The drain of $M_{OUT}$ 204 is coupled to the external load, $R_{LOAD}$ 200. $R_{LOAD}$ 200 is coupled between the output OUT 224 and ground 240.

A constant current source, $I_{REF}$ 212, again biases the drain current of $M_{SENSE}$ 208 to create the reference voltage, $V_{REF}$ 228. OUT 224 and $V_{REF}$ 228 are compared using, for example, a comparitor 232 to create the over current signal (OC) 236. The operation of the second embodiment is similar to that of the first embodiment. The load current, $I_{LOAD}$, necessary to assert the OC signal 236 is again given by $n \times I_{REF}$ where n is the sense ratio.

Figure 4:
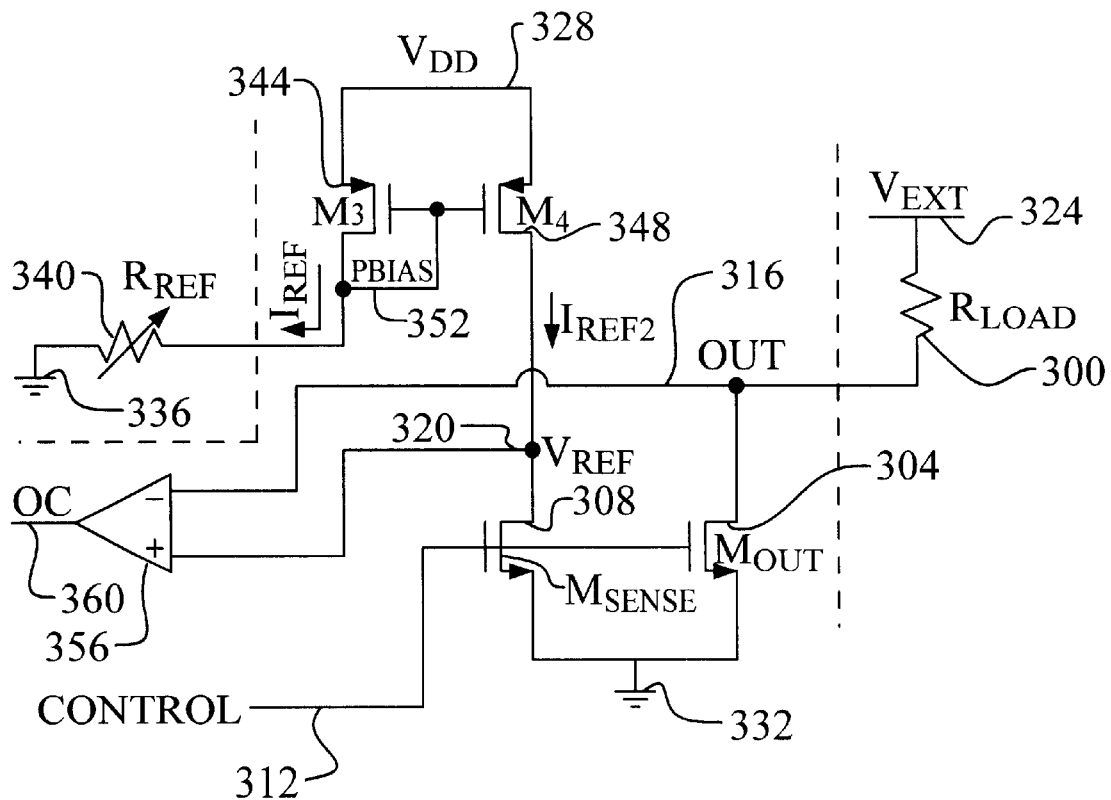
FIG. 4 illustrates a third preferred embodiment including a means of adjusting the reference current source value.

Referring now to FIG. 4, a third embodiment of the present invention is illustrated. In this embodiment, a particular implementation of a constant current source is shown. The configuration of the third embodiment shows a low-side drive scheme as in the first embodiment. However, a particular constant current source implementation is used. This implementation is based on a simple current source and mirror using an external resistor $R_{REF}$ 340.

A reference current, $I_{REF}$, is created by the stack of the diode-connected, PMOS transistor, M3 344, and $R_{REF}$ 340. Note that the value of $R_{REF}$ 340 may be adjustable, or trimmable, to account for process variation and to allow the current sense to be precisely set. For example, $R_{REF}$ 340 may comprise a variable resistor, such as potentiometer, or laser-adjustable resistor array. In addition, $R_{REF}$ 340 may comprise an on-chip network that is adjusted during final test. The reference current, $R_{REF}$ 340, is mirrored by M4 348 to create the constant current reference, $I_{REF2}$, for the current sense circuit.

Figure 5:
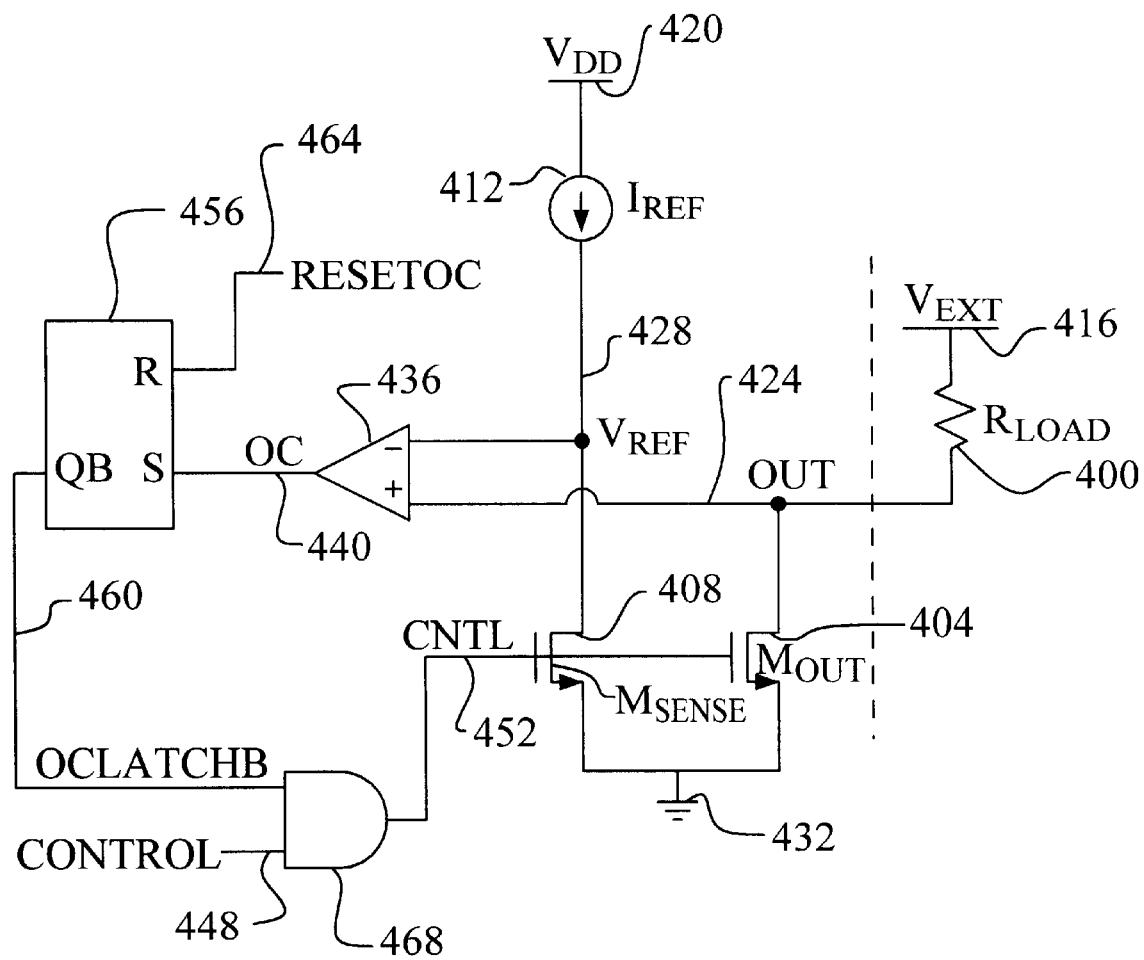
FIG. 5 illustrates a fourth preferred embodiment including a means of turning OFF the output during an over current condition.

Referring now to FIG. 5, a fourth preferred embodiment of the present invention is illustrated. In this configuration, an exemplary circuit means for turning OFF the CONTROL signal is shown. An S-R latch 456 is added. The over current signal, OC 440, is used to set the S-R latch when asserted. The QB state of the latch, OCLATCHB, is used to disable the CONTROL signal 448 by means of a logic gate 468. A latch reset signal, RESETOC 464, must be asserted by the control circuit to re-enable the output. In this way, the novel current sense circuit of the present invention can be used in a current limit application to protect the output transistor, $M_{OUT}$ 404.

The present invention provides a unique and advantageous means to, among other applications, protect the output transistor, to protect the integrated circuit, to limit the output current to avoid an extensive voltage drop on the voltage source, and to avoid a battery discharge in the event of a short circuit.

The advantages of the present invention may now be summarized. First, an improved MOS current sense circuit has been achieved. Second, the novel configuration of the current sense circuit improves sensing precision by operating both the output transistor and the sense transistor in the ohmic or linear region. Third, both NMOS and PMOS versions of the circuit are achieved. Fourth, the constant current source reference may be varied or trimmed to improve precision. Finally, the novel circuit may be incorporated into a current limit scheme.

As shown in the preferred embodiments, the novel current sense circuit provides an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A current sense circuit comprising:
   a first MOS transistor having a gate, a drain, and a source wherein said gate is coupled to a control signal and wherein said drain is coupled to a load such that a load current flows through said first MOS transistor when said control signal is ON;
   a second MOS transistor having a gate, a drain, and a source wherein said gate is coupled to said control signal, wherein said drain is coupled to a constant current source such that said constant current flows through said second MOS transistor when said control signal is ON, wherein said source is coupled to said source of said first MOS transistor, and wherein said first and second MOS transistors are operating in the linear region when said control signal is ON; and
   a means to compare said first MOS transistor drain voltage and said second MOS transistor drain voltage.

2. The circuit according to claim 1 wherein said first MOS transistor has a first width-to-length ratio, wherein said second MOS transistor has a second width-to length ratio, wherein the quotient of said first width-to-length ratio divided by said second width-to-length ratio is a sense ratio, and wherein said first MOS transistor drain voltage exceeding said second MOS transistor drain voltage implies said load current value exceeds the product of said sense ratio multiplied by said constant current.

3. The circuit according to claim 1 wherein said sense ratio is between about 1 and 10,000.

4. The circuit according to claim 2 further comprising a means to turn OFF said control signal when said first MOS transistor drain voltage exceeds said second MOS transistor drain voltage.

5. The circuit according to claim 1 wherein said first and second MOS transistors comprise one of the group containing: NMOS transistors and PMOS transistors.

6. The circuit according to claim 1 wherein said constant current source value is adjustable.

7. The circuit according to claim 1 wherein said first and second MOS transistors have common length, common physical orientation, and are formed on a common substrate.

8. The circuit according to claim 1 wherein said means of comparing comprises a comparitor.

9. A current sense circuit comprising:
   a first MOS transistor having a gate, a drain, and a source wherein said gate is coupled to a control signal, wherein said drain is coupled to a load such that a load current flows through said first MOS transistor when said control signal is ON, and wherein said first MOS transistor has a first width-to-length ratio;
   a second MOS transistor having a gate, a drain, and a source wherein said gate is coupled to said control signal,
   wherein said drain is coupled to a constant current source such that said constant current flows through said second MOS transistor when said control signal is ON, wherein said source is coupled to said source of said first MOS transistor, wherein said first and second MOS transistors are operating in the linear region when said control signal is ON, wherein said second MOS transistor has a second width-to-length ratio, and wherein the quotient of said first width-to-length ratio divided by said second width-to-length ratio is a sense ratio; and
   a means to compare said first MOS transistor drain voltage and said second MOS transistor drain voltage wherein said first MOS transistor drain voltage exceeding said second MOS transistor drain voltage implies said load current value exceeds the product of said sense ratio multiplied by said constant current.

10. The circuit according to claim 9 wherein said sense ratio is between about 1 and 10,000.

11. The circuit according to claim 9 further comprising a means to turn OFF said control signal when said first MOS transistor drain voltage exceeds said second MOS transistor drain voltage.

12. The circuit according to claim 9 wherein said first and second MOS transistors comprise one of the group containing: NMOS transistors and PMOS transistors.

13. The circuit according to claim 9 wherein said constant current source value is adjustable..

14. The circuit according to claim 9 wherein said first and second MOS transistors have common length, common physical orientation, and are formed on a common substrate.

15. The circuit according to claim 9 wherein said means of comparing comprises a comparitor.

16. A current sense circuit comprising:
   a first NMOS transistor having a gate, a drain, and a source wherein said gate is coupled to a control signal, wherein said drain is coupled to a load such that a load current flows through said first NMOS transistor when said control signal is ON, and wherein said first NMOS transistor has a first width-to-length ratio;
   a second NMOS transistor having a gate, a drain, and a source wherein said gate is coupled to said control signal, wherein said drain is coupled to a constant current source such that said constant current flows through said second NMOS transistor when said control signal is ON, wherein: said source is coupled to said source of said first NMOS transistor, wherein said first and second MOS transistors are operating in the linear region when said control signal is ON, wherein said second NMOS transistor has a second width-to-length ratio, and wherein the quotient of said first width-to-length ratio divided by said second width-to-length ratio is a sense ratio; and
   a comparitor to compare said first NMOS transistor drain voltage and said second NMOS transistor drain voltage wherein said first NMOS transistor drain voltage exceeding said second NMOS transistor drain voltage implies said load current value exceeds the product of said sense ratio multiplied by said constant current.

17. The circuit according to claim 16 wherein said sense ratio is between about 1 and 10,000.

18. The circuit according to claim 16 further comprising a means to turn OFF said control signal when said first NMOS transistor drain voltage exceeds said second NMOS transistor drain voltage.

19. The circuit according to claim 16 wherein said constant current source value is adjustable.

20. The circuit according to claim 16 wherein said first and second NMOS transistors have common length, common physical orientation, and are formed on a common substrate.

* * * * *

UNITED STATES PATENT AND TRADEMARK OFFICE
CERTIFICATE OF CORRECTION

| | |
|---|---|
| PATENT NO. | : 6,479,975 B1 |
| APPLICATION NO. | : 09/978232 |
| DATED | : November 12, 2002 |
| INVENTOR(S) | : Manfred Plankensteiner and Horst Knoedgen |

It is certified that error appears in the above-identified patent and that said Letters Patent is hereby corrected as shown below:

Title Pg, Item (73) Assignee: delete Assignee, "Dialog Semicon, Kirchhein/Teck-Nabern (DE)" and replace with -- Dialog Semiconductor GmbH, Kirchheim/Teck-Nabern (DE) --.

Signed and Sealed this

Twenty-first Day of April, 2009

JOHN DOLL
*Acting Director of the United States Patent and Trademark Office*